United States Patent
Dip et al.

(10) Patent No.: US 7,468,311 B2
(45) Date of Patent: Dec. 23, 2008

(54) DEPOSITION OF SILICON-CONTAINING FILMS FROM HEXACHLORODISILANE

(75) Inventors: Anthony Dip, Cedar Creek, TX (US); Seungho Oh, Austin, TX (US); Allen John Leith, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 123 days.

(21) Appl. No.: 10/673,375

(22) Filed: Sep. 30, 2003

(65) Prior Publication Data

US 2005/0066892 A1    Mar. 31, 2005

(51) Int. Cl.
*H01L 21/20* (2006.01)
(52) U.S. Cl. ....................... 438/478; 438/481
(58) Field of Classification Search ................ 438/656, 438/287, 300, 478, 481; 427/255.394, 255.28, 427/248.1, 123, 255.29
See application file for complete search history.

(56) References Cited

U.S. PATENT DOCUMENTS

| | | | |
|---|---|---|---|
| 5,766,342 A | 6/1998 | Shibuya et al. | |
| 6,184,158 B1 | 2/2001 | Shufflebotham et al. | |
| 6,884,464 B2 * | 4/2005 | Luo et al. | 427/255.29 |
| 2002/0164890 A1 | 11/2002 | Kwan et al. | |
| 2003/0113971 A1 * | 6/2003 | Nagaoka et al. | 438/287 |
| 2003/0215570 A1 * | 11/2003 | Seutter et al. | 427/255.394 |
| 2004/0175893 A1 * | 9/2004 | Vatus et al. | 438/300 |
| 2007/0240632 A1 * | 10/2007 | Singh et al. | 117/106 |

FOREIGN PATENT DOCUMENTS

| | | |
|---|---|---|
| JP | 62-229930 | 10/1987 |
| TW | 432493 | 5/2001 |
| TW | 477075 | 2/2002 |
| TW | 483054 | 4/2002 |

* cited by examiner

*Primary Examiner*—Tuan H Nguyen
(74) *Attorney, Agent, or Firm*—Oblon, Spivak, McClelland, Maier & Neustadt, P.C.

(57) ABSTRACT

A method is provided for depositing a silicon-containing film on a substrate by a low pressure deposition process in a processing system. A silicon-containing film can be formed on a substrate by providing a substrate in a process chamber of a processing system, heating the substrate, and exposing a hexachlorodisilane (HCD) process gas to the substrate. The method can selectively deposit an epitaxial silicon-containing film on a silicon surface of a substrate or, alternately, non-selectively deposit a silicon-containing film on a substrate. A processing tool containing a processing system for forming a silicon-containing film on s substrate using a HCD process gas is provided.

29 Claims, 9 Drawing Sheets

DEPOSITION OF SILICON-CONTAINING FILMS FROM HEXACHLORODISILANE

FIELD OF THE INVENTION

The present invention relates to semiconductor processing, and more particularly, to a process and a processing tool for depositing silicon-containing films on a substrate using a hexachlorodisilane (HCD) process gas.

BACKGROUND OF THE INVENTION

Silicon-containing films are used for a wide variety of applications in the semiconductor industry. Silicon-containing films include silicon films such as polycrystalline silicon (poly-Si) and epitaxial silicon, silicon germanium (SiGe), silicon germanium carbide (SiGeC), silicon carbide (SiC), and silicon nitride (SiN). As circuit geometries shrink to ever smaller feature sizes, lower deposition temperatures are preferred, for example because of introduction of new materials into semiconductor devices and reduction of thermal budgets of shallow implants in source and drain regions. Moreover, it is evident that non-selective (blanket) and selective deposition of silicon-containing films will be needed for future devices. For example, semiconductor fabrication requires tight specification limits on thickness and resistivity for epitaxial silicon films. Epitaxial silicon deposition can be a first step in a process flow where the crystal lattice of the bulk silicon is extended through growth of a new silicon-containing layer that may have a different doping level than the bulk. Matching target epitaxial film thickness and resisitivity parameters is important for the subsequent fabrication of properly functioning devices.

One example of the use of selective deposition of epitaxial silicon-containing films is for manufacturing silicon-on-insulator (SOI) devices with raised source and drains. During SOI device fabrication, processing may consume an entire silicon film in source and drain regions, thereby requiring extra silicon in these regions that can be provided by selective epitaxial growth (SEG) of silicon-containing films. Selective epitaxial deposition of silicon-containing films can reduce the number of photolithography and etching steps that are needed, which can reduce the overall cost and complexity involved in manufacturing a device. Despite the preference for lower temperature deposition processes, thermal deposition of epitaxial silicon using the traditional silane ($SiH_4$) and dichlorosilane (DCS, $SiCl_2H_2$) source gases generally require high deposition temperatures (e.g., greater than about 850-900° C.) to achieve deposition rates that are high enough for the process to be incorporated into processes for manufacturing of devices. Moreover, the traditional silane and dichlorosilane source gas processes have limited deposition selectivity with respect to different substrate materials. Thus, the present inventors have recognized that improved methods are needed for deposition of silicon-containing films onto substrates that permit selective deposition and deposition at reduced temperatures.

SUMMARY OF THE INVENTION

An object of the present invention is to provide a method and system for deposition of silicon-containing films on a semiconductor wafer in a process chamber of a processing system which reduces or solves the above described and/or other problems with prior art deposition systems and methods.

Another object of the present invention is to provide a method and system for low temperature selective deposition of epitaxial silicon-containing films on a semiconductor wafer in a process chamber of a processing system.

Yet another object of the present invention is to provide a method and system for low temperature non-selective deposition of silicon-containing films on a semiconductor wafer in a process chamber of a processing system.

Still another object of the present invention is to provide a cost effective mechanism for integrating silicon-containing films with semiconductor applications.

These and/or other objects of the present invention may be realized by a method of depositing a silicon-containing film on a substrate. The method includes providing a substrate in a process chamber of a processing system, heating the substrate, flowing a hexachlorodisilane (HCD) process gas in the process chamber, and depositing a silicon-containing film on the substrate.

In another aspect of the invention, a processing tool is provided for depositing a silicon-containing film on a substrate. The processing tool contains a transfer system configured for providing a substrate in a process chamber of a processing system, a heater for heating the substrate, a gas injection system configured for exposing a HCD process gas to the substrate to deposit a silicon-containing film on the substrate, and a controller configured to control the processing tool.

DETAILED DESCRIPTION OF THE INVENTION

Figure 1A:
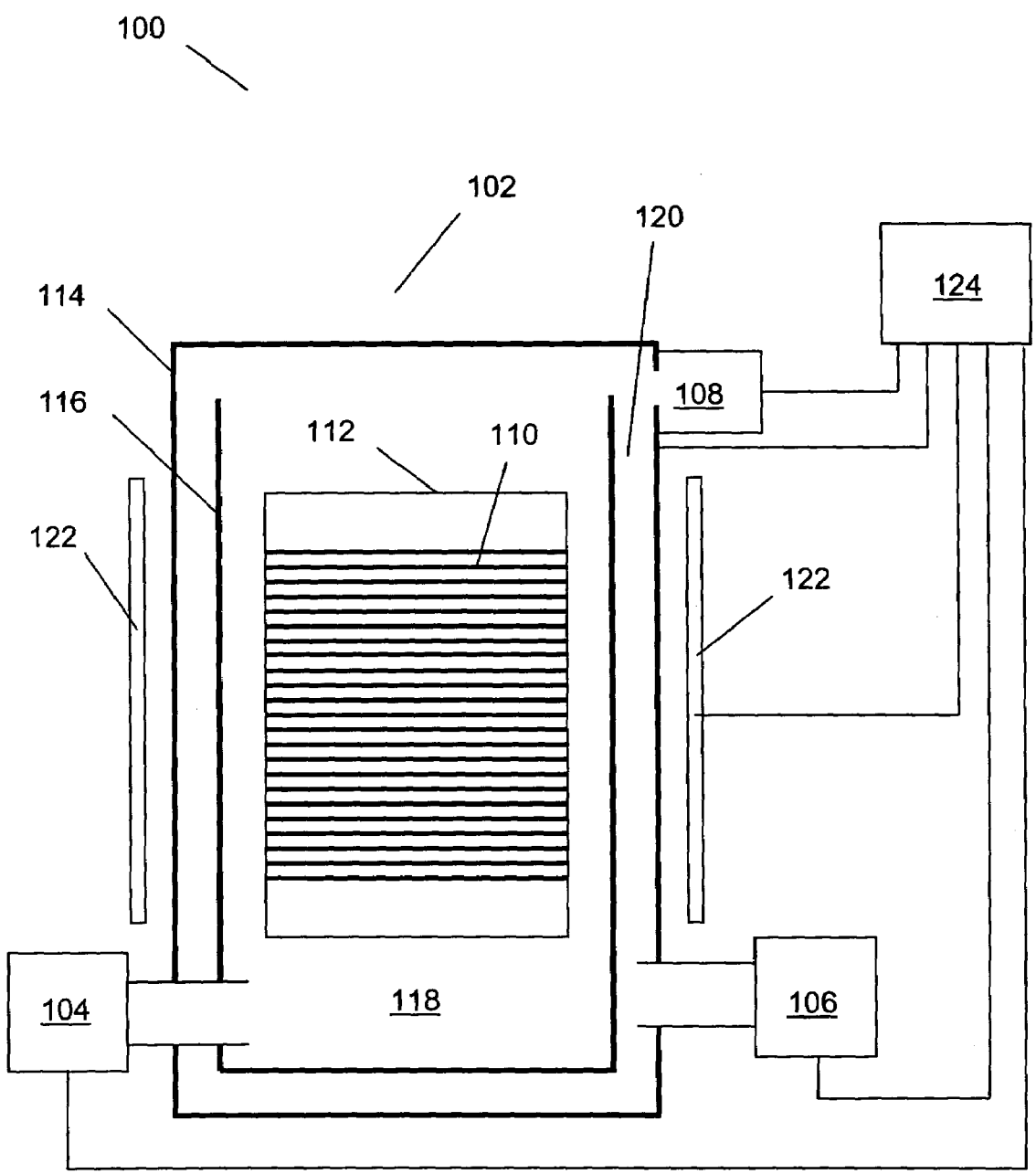
FIG. 1A shows a simplified block diagram of a batch type processing system for depositing a silicon-containing film on a substrate according to an embodiment of the invention.

As noted in the Background of the Invention section above, the use of traditional silicon source gases will not provide low temperature deposition of silicon-containing films or sufficient selectivity of the film growth. Nevertheless, use of other silicon source gases has gone largely unstudied, perhaps due to the difficulty of implementing new source gases in the semiconductor industry and the problem of providing uniform process results at different wafer positions in a batch type process chamber. Thus, the present inventors have conducted experiments to analyze the use of a hexachlorodisilane (HCD, $Si_2Cl_6$) process gas to deposit a silicon-containing film on a substrate. As a result of such experiments and analysis, the present inventors have discovered that low pressure exposure of a HCD process gas provides a feasible mechanism for low temperature deposition of a silicon-containing film on a substrate in a processing system.

In general, low pressure silicon deposition on a substrate can result in the formation of a mono-crystalline (epitaxial) silicon film, a polycrystalline silicon film, or an amorphous silicon film. In one embodiment of the invention, silicon epitaxial deposition on a crystalline silicon substrate can be used to form a mono-crystalline silicon film, where the crystalline silicon substrate acts as a "seed" for the mono-crystalline growth. An epitaxial silicon-containing layer can be designed to have different compositional and electrical properties from the underlying Si wafer and tailored to the specific demands of the device. An epitaxial silicon-containing film can be doped by adding a small amount of a dopant gas to the HCD process gas. Examples of dopant gases include phosphor-containing gases (e.g., $PH_3$), arsenic-containing gases (e.g., $AsH_3$), nitrogen-containing gases (e.g., $NH_3$), and boron-containing gases (e.g., $B_2H_6$ and $BCl_3$). The addition of any of the abovementioned dopant gases to the HCD process gas can furthermore increase the selectivity of silicon deposition by accelerating the silicon deposition due to the presence of hydrogen on the substrate during the process. Also, the addition of halogen-containing gases such as HF, $F_2$, and HCl to the HCD process gas can improve the selectivity of silicon deposition on silicon surfaces by etching and removing silicon atoms deposited on non-silicon surfaces.

In an embodiment of the invention, a silicon-containing film containing silicon and germanium (SiGe) can be deposited with good selectivity using a HCD process gas containing HCD and a germanium-containing gas, e.g., $GeH_4$ or $GeCl_4$. The SiGe film can contain a low concentration of germanium, for example less than about 2 atomic percent germanium, or the SiGe film can contain greater than 2 atomic percent germanium, for example about 50 atomic percent.

In another embodiment of the invention, where the HCD process gas is not exposed to a silicon surface but to other surfaces containing materials such as oxides, nitrides, or metals, deposition of a silicon-containing film using a HCD process gas can form a polycrystalline silicon-containing film having fine silicon grains, or an amorphous silicon-containing film. The grain size in a polycrystalline silicon-containing film can depend on deposition conditions as well as heat treatments.

HCD is a commercially available silicon compound that is highly reactive and a very strong deoxygenation agent. As a result of experiments and analysis of using a HCD process gas to deposit silicon-containing films in a processing system, the present inventors have discovered a low-pressure thermal decomposition process using a HCD process gas to deposit a silicon-containing film on a substrate at a deposition rate that is higher than can be achieved at the same temperature using conventional decomposition of DCS in the presence of $H_2$ or HCl. The higher deposition rate that can be obtained using HCD can, for example, allow manufacturable deposition processes to be carried out at a lower substrate temperature, while achieving sufficiently high deposition rates of silicon-containing films. Although the abovementioned experiments were carried out in a batch type processing system, the invention is not limited to such processing systems and can also be practiced in single wafer processing systems as will be appreciated by one skilled in the art.

In particular, a silicon-containing film can be deposited on a substrate using a HCD process gas in a low pressure deposition process in a processing system. In the process, a substrate is provided in a process chamber, the chamber pressure lowered using a vacuum pumping system, and the chamber temperature and pressure stabilized. Next, the process chamber temperature and process chamber pressure can be adjusted to the desired values. When the process temperature is reached, the substrate can be processed for a time period that results in formation of a desired silicon-containing film on the substrate. At the end of the process, the process chamber can be evacuated and purged with an inert gas, and the substrate removed from the process chamber. In addition, a process of pretreating a substrate prior to depositing a silicon-containing film, can include exposing a substrate to a cleaning gas, for example a $H_2$ gas at a substrate temperature of 900° C., to remove contaminants and oxide layers from the substrate.

Referring now to the drawings, FIG. 1A shows a simplified block diagram of a batch type processing system for depositing a silicon-containing film on a substrate according to an embodiment of the invention. The batch type processing system 100 includes a process chamber 102, a gas injection system 104, a heater 122, a vacuum pumping system 106, a process monitoring system 108, and a controller 124. Multiple substrates 110 can be loaded into the process chamber 102 and processed using substrate holder 112. Furthermore, the process chamber 102 comprises an outer section 114 and an inner section 116. In one embodiment of the invention, the inner section 116 can be a process tube.

The gas injection system 104 can introduce gases into the process chamber 102 for purging the process chamber 102, and for preparing, cleaning, and processing the substrates 110. The gas injection system 104 can, for example, include a liquid delivery system (LDS) that contains a vaporizer to vaporize a HCD liquid. The vaporized liquid can be flowed into the process chamber 102 with the aid of a carrier gas. Alternately, the gas injection system can include a bubbling system where a carrier gas is bubbled through a reservoir containing the HCD precursor. A plurality of gas supply lines can be arranged to flow gases into the process chamber 102. The gases can be introduced into volume 118, defined by the inner section 116, and exposed to substrates 110. Thereafter, the gases can flow into the volume 120, defined by the inner section 116 and the outer section 114, and exhausted from the process chamber 102 by the vacuum pumping system 106.

Substrates 110 can be loaded into the process chamber 102 and processed using substrate holder 112. The batch type processing system 100 can allow for a large number of tightly stacked substrates 110 to be processed, thereby resulting in high substrate throughput. A substrate batch size can, for example, be about 100 substrates (wafers), or less. Alternately, the batch size can be about 25 substrates, or less. The process chamber 102 can, for example, process a substrate of any size, for example 200 mm substrates, a 300 mm substrates, or an even larger substrates. The substrates 110 can, for example, comprise semiconductor substrates (e.g. silicon or compound semiconductor), LCD substrates, and glass substrates. In addition to clean substrates, substrates with multiple films formed thereon can be utilized, including but not limited to, silicon films, metal films, oxide films, nitride films, and oxynitride films.

The batch type processing system 100 can be controlled by a controller 124 capable of generating control voltages sufficient to communicate and activate inputs of the batch type processing system 100 as well as monitor outputs from the batch type processing system 100. Moreover, the controller 124 can be coupled to and exchange information with process chamber 102, gas injection system 104, heater 122, process monitoring system 108, and vacuum pumping system 106. For example, a program stored in the memory of the controller 124 can be utilized to control the aforementioned components of the batch type processing system 100 according to a stored process recipe. One example of controller 124 is a DELL PRECISION WORKSTATION 610™, available from Dell Corporation, Dallas, Tex.

Real-time process monitoring can be carried out using process monitoring system 108. In general, the process monitoring system 108 is a versatile monitoring system and can, for example, comprise a mass spectrometer (MS) or a Fourier Transform Infra-red (FTIR) spectrometer. The process monitoring system 108 can provide qualitative and quantitative analysis of the gaseous chemical species in the process environment. Process parameters that can be monitored include gas flows, gas pressure, ratios of gaseous species, and gas purities. These parameters can be correlated with prior process results and various physical properties of the deposited silicon-containing film.

Figure 1B:
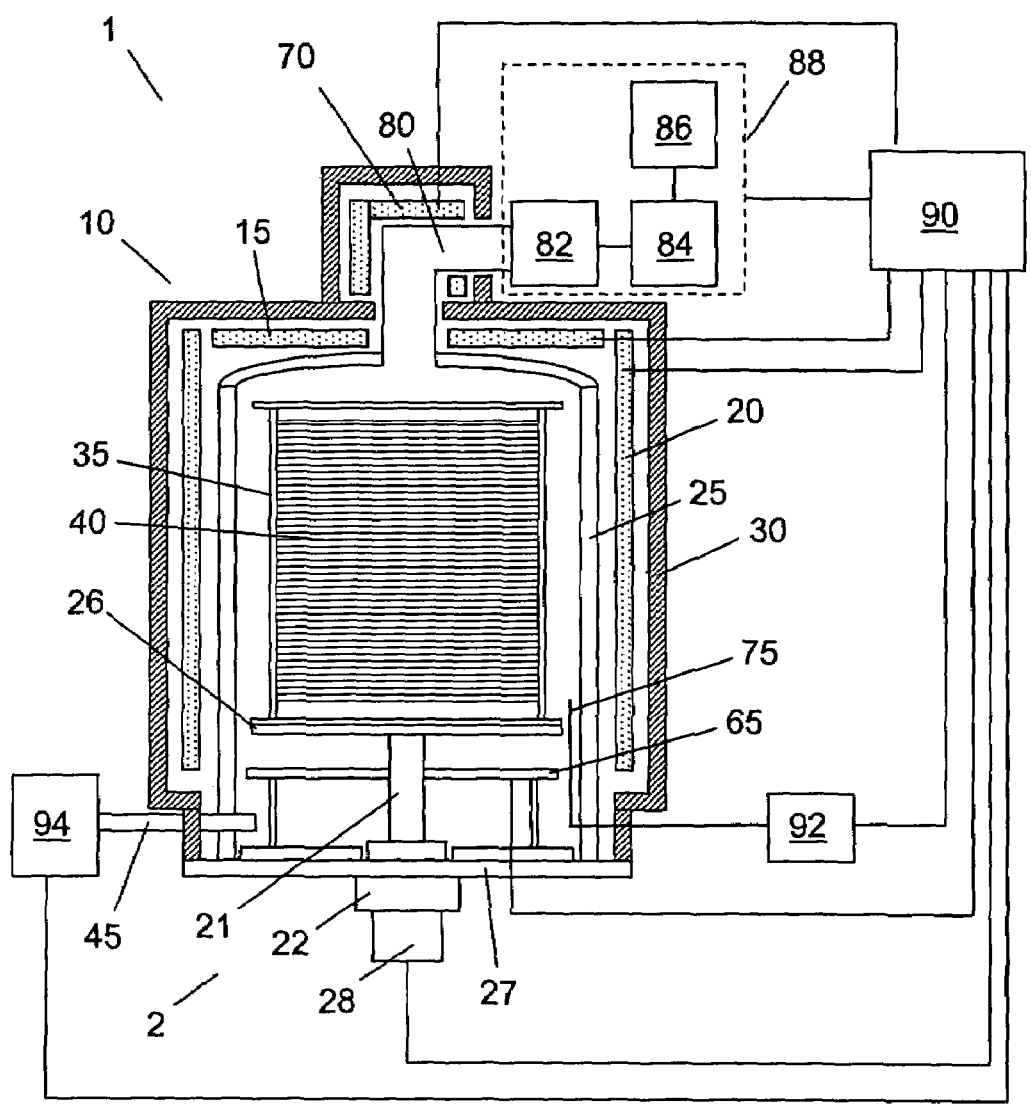
FIG. 1B shows a simplified block diagram of another batch type processing system for depositing a silicon-containing film on a substrate according to an embodiment of the invention.

FIG. 1B shows a simplified block diagram of another batch type processing system for depositing a silicon-containing film on a substrate according to an embodiment of the invention. The batch type processing system 1 contains a process chamber 10 and a process tube 25 that has a upper end connected to a exhaust pipe 80, and a lower end hermetically joined to a lid 27 of cylindrical manifold 2. The exhaust pipe 80 discharges gases from the process tube 25 to a vacuum pumping system 88 to maintain a pre-determined atmospheric or below atmospheric pressure in the processing system 1. A substrate holder 35 for holding a plurality of substrates (wafers) 40 in a tier-like manner (in respective horizontal planes at vertical intervals) is placed in the process tube 25. The substrate holder 35 resides on a turntable 26 that is mounted on a rotating shaft 21 penetrating the lid 27 and driven by a motor 28. The turntable 26 can be rotated during processing to improve overall film uniformity or, alternately, the turntable can be stationary during processing. The lid 27 is mounted on an elevator 22 for transferring the substrate holder 35 in and out of the reaction tube 25. When the lid 27 is positioned at its uppermost position, the lid 27 is adapted to close the open end of the manifold 2.

A plurality of gas supply lines can be arranged around the manifold 2 to supply a plurality of gases into the process tube 25 through the gas supply lines. In FIG. 1B, only one gas supply line 45 among the plurality of gas supply lines is shown. The gas supply line 45 is connected to a gas injection system 94. A cylindrical heat reflector 30 is disposed so as to cover the reaction tube 25. The heat reflector 30 has a mirror-finished inner surface to suppress dissipation of radiation heat radiated by main heater 20, bottom heater 65, top heater 15, and exhaust pipe heater 70. A helical cooling water passage (not shown) is formed in the wall of the process chamber 10 as cooling medium passage.

A vacuum pumping system 88 comprises a vacuum pump 86, a trap 84, and automatic pressure controller (APC) 82. The vacuum pump 86 can, for example, include a dry vacuum pump capable of a pumping speed up to 20,000 liters per second (and greater). During processing, gases can be introduced into the process chamber 10 via the gas injection system 94 and the process pressure can be adjusted by the APC 82. The trap 84 can collect unreacted precursor material and by-products from the process chamber 10.

The process monitoring system 92 comprises a sensor 75 capable of real-time process monitoring and can, for example, comprise a MS or a FTIR spectrometer. A controller 90 includes a microprocessor, a memory, and a digital I/O port capable of generating control voltages sufficient to communicate and activate inputs to the processing system 1 as well as monitor outputs from the processing system 1. Moreover, the controller 90 is coupled to and can exchange information with gas injection system 94, motor 28, process monitoring system 92, heaters 20, 15, 65, and 70, and vacuum pumping system 88. As with the controller 124 of FIG. 1A, the controller 90 may be implemented as a DELL PRECISION WORKSTATION 610™.

Figure 2:
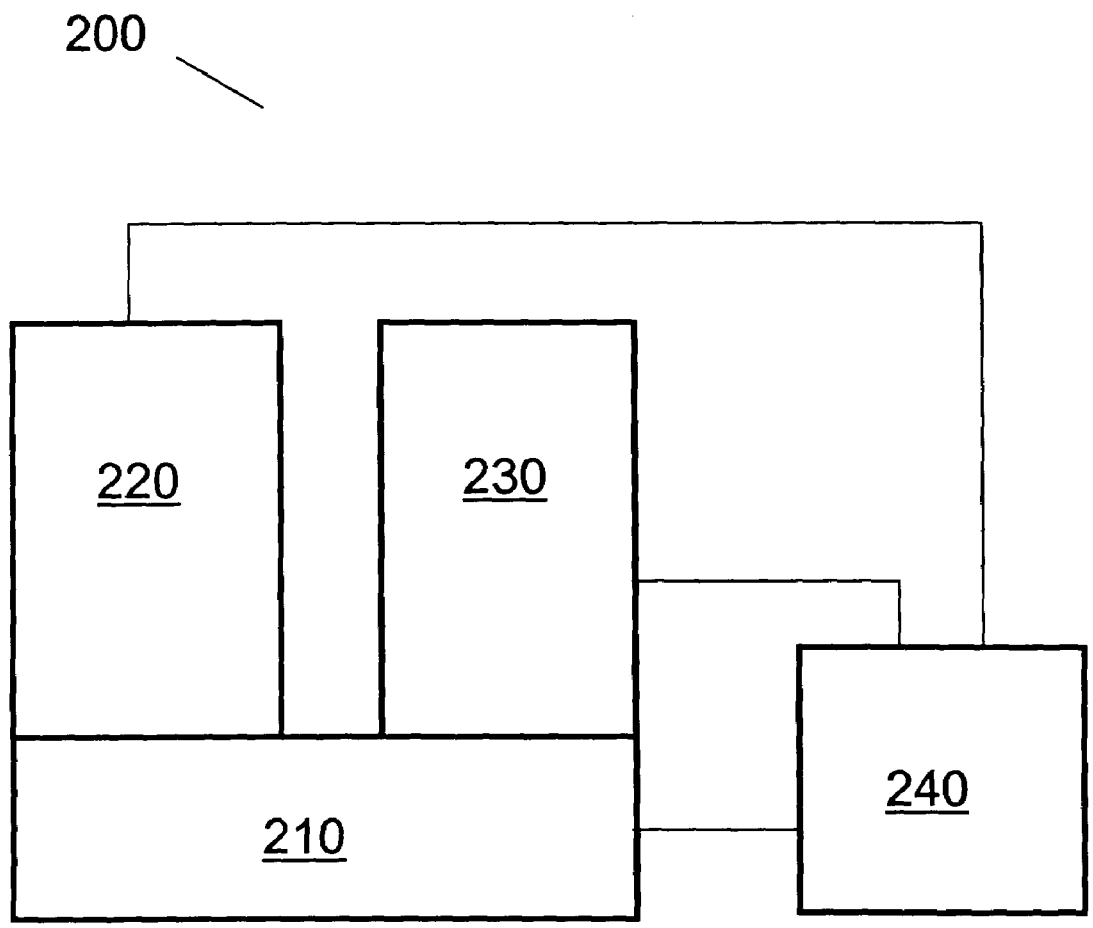
FIG. 2 shows a simplified block diagram of a processing tool according to an embodiment of the invention.

FIG. 2 shows a simplified block diagram of a processing tool according to an embodiment of the invention. The processing tool 200 comprises processing systems 220 and 230, a (robotic) transfer system 210 configured for transferring substrates within the processing tool 200, and a controller 240 configured to control the processing tool 200. In another embodiment of the invention, the processing tool 200 can comprise a single processing system or, alternately, can comprise more than two processing systems. In FIG. 2, the processing systems 220 and 230 can, for example, perform at least one of the following processes: (a) pretreat a substrate, (b) deposit a silicon-containing film on a substrate, and (c) determine the properties of at least one of a substrate and a silicon-containing film deposited on a substrate. In (a), a pretreating can, for example, be carried out to remove contaminants and/or thin oxide films (e.g, a native oxide film or a chemical oxide film) from the substrate surface. The presence of contaminants or oxide films on a silicon surface can inhibit formation of a proper silicon seed (nucleation) layer and thereby affect epitaxial silicon deposition. In one example, a pretreating can include exposing a substrate to a $H_2$ gas at a substrate temperature between about 500° C. and about 1000° C., for example 900° C. In (c), a film property may, for example, include thickness and dopant levels of a silicon-containing film. In one embodiment of the invention, each of the processes (a)-(c) can be performed in different processing systems. In another embodiment of the invention, at least two of the processes (a)-(c) are carried out in the same processing system. In one embodiment of the invention, at least one of the processing systems can include a batch type processing system or a single wafer processing system. In another embodiment of the invention, at least one of the processing systems can include a thermal processing system, a plasma processing system, or an atomic layer deposition system.

As with the controllers in FIGS. 1A and 1B, the controller 240 may be implemented as a DELL PRECISION WORKSTATION 610™. Moreover, the controller of any of FIGS. 1A-1B and 2 may be implemented as a general purpose computer system such as that described with respect to FIG. 8.

Figure 3:
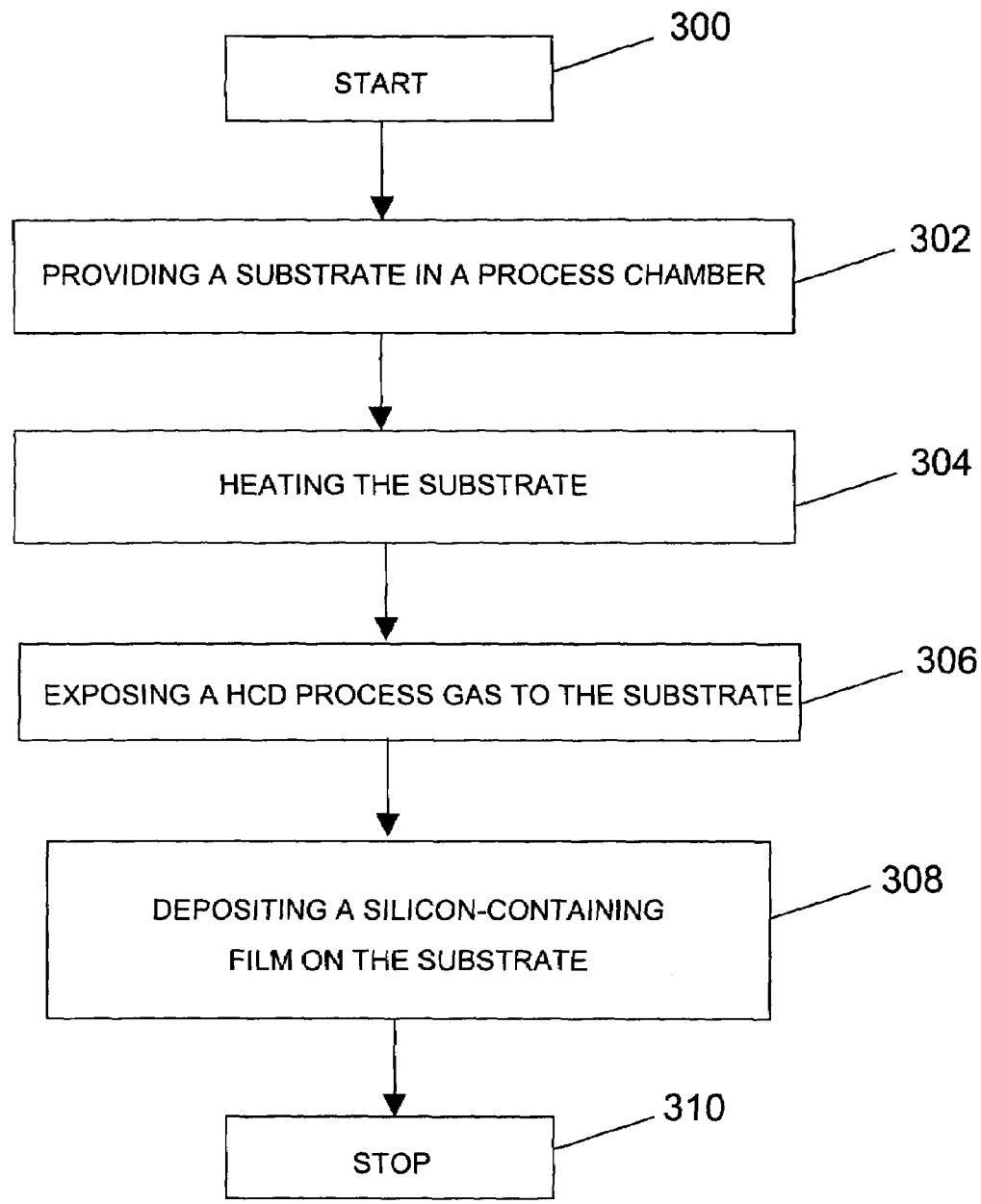
FIG. 3 shows a flow diagram for depositing a silicon-containing film on a substrate according to an embodiment of the invention.

FIG. 3 shows a flow diagram for depositing a silicon-containing film on a substrate according to an embodiment of the invention. In 300, the process is started. In 302, a substrate is provided in a process chamber of a processing system. The processing system may be the batch type processing system described in FIG. 1A or 1B, and may be provided as a part of a processing tool such as described in FIG. 2. In 304, the substrate is heated, and in 306 a HCD process gas is exposed to the substrate. In one embodiment of the invention, the HCD process gas can contain HCD gas and optionally an inert gas, and the silicon-containing film can be a silicon film. The inert gas can, for example, be selected from He, Ne, Ar, Kr, Xe, and $N_2$ or any other gas that does not chemically react with the substrate or chamber environment. The inert gas may be used as a carrier gas for HCD in liquid form, or to dilute the HCD gas in order to reduce the occurrence of chemical reactions in the chamber environment rather than on the substrate surface. In another embodiment of the invention, the HCD process gas can contain HCD gas and optionally an inert gas and at least one of a hydrogen-containing gas, and a second silicon-containing gas. The hydrogen-containing gas can, for example, contain $H_2$. It was observed that addition of $H_2$ to the HCD gas increased the silicon deposition rate. The second silicon-containing gas can, for example, be selected from $SiH_4$, $SiCl_4$, $Si_2H_6$, and $SiCl_2H_2$. In still another embodiment of the invention, the HCD process gas can contain HCD gas and a dopant gas that can, for example, be selected from a phosphor-containing gas (e.g., $PH_3$), an arsenic-containing gas (e.g., $AsH_3$), a nitrogen-containing gas (e.g., $NH_3$), and a boron-containing gases (e.g., $B_2H_6$ and $BCl_3$). In another embodiment of the invention, the HCD process gas can contain a halogen-containing gas that can, for example, be selected from HF, $F_2$, $Cl_2$, and HCl. In yet another embodiment of the invention, the HCD process gas can contain HCD gas and a germanium-containing gas that can, for example, be selected from $GeH_4$ and $GeCl_4$, to deposit a SiGe film.

In one embodiment of the invention, the deposition process depicted in the flow diagram in FIG. 3, can further include pretreating the substrate prior to depositing the silicon-containing film. The pretreating process can, for example, substantially remove an oxide layer (e.g., a native oxide or a thermal oxide) from a substrate material (e.g., silicon), and other interfacial contamination, that can inhibit formation of a proper silicon seed (nucleation) layer, prevent deposition of a silicon-containing film on the deposition surface, and reduce the selectivity of the silicon deposition. In one example, a pretreating can include exposing a silicon substrate to a $H_2$ gas at a substrate temperature of 900° C.

Processing conditions used for depositing a silicon-containing film can include a process chamber pressure less than about 100 Torr. Alternately, the process pressure can be less than about 1 Torr, for example about 0.4 Torr. The process conditions can further include a substrate temperature between about 500° C. and about 900° C., preferably about 800° C. In one embodiment of the invention, the substrate temperature can be about 800° C. and the process chamber pressure can be about 0.4 Torr. In 308 a silicon-containing film is deposited on the substrate from decomposition of the HCD process gas.

In one embodiment of the invention, the inventors have discovered a method to selectively deposit an epitaxial silicon-containing film on substrate using a HCD process gas in a process chamber of a batch type processing system. Selective epitaxial deposition of a silicon-containing film was observed on surface areas containing silicon, and no or little silicon deposition was observed on other surface areas containing, for example, oxides (e.g., an oxide photomask) or nitrides (e.g., a SiN layer). The inventors speculate that the higher silicon deposition rate that is observed using a HCD process gas compared to when using the conventional DCS process gas, results in the epitaxial deposition of a silicon-containing film to be more selective. In general, deposition selectivity with respect to deposition onto different substrate materials can be achieved when the nucleation time (incubation time) for the silicon-containing film deposition differs enough for one substrate material compared to another substrate material. In practice, if the deposition rate of a silicon-containing film is high enough and the incubation time difference is large enough for different materials, a silicon-containing film can be grown on the material with the shorter incubation time (e.g., silicon) before deposition starts on other materials with longer incubation times (e.g., oxides or nitrides). As a result, a thicker epitaxial silicon-containing film can be grown on clean silicon substrate using HCD process gas before deposition starts in other areas on the substrate.

Figure 4:
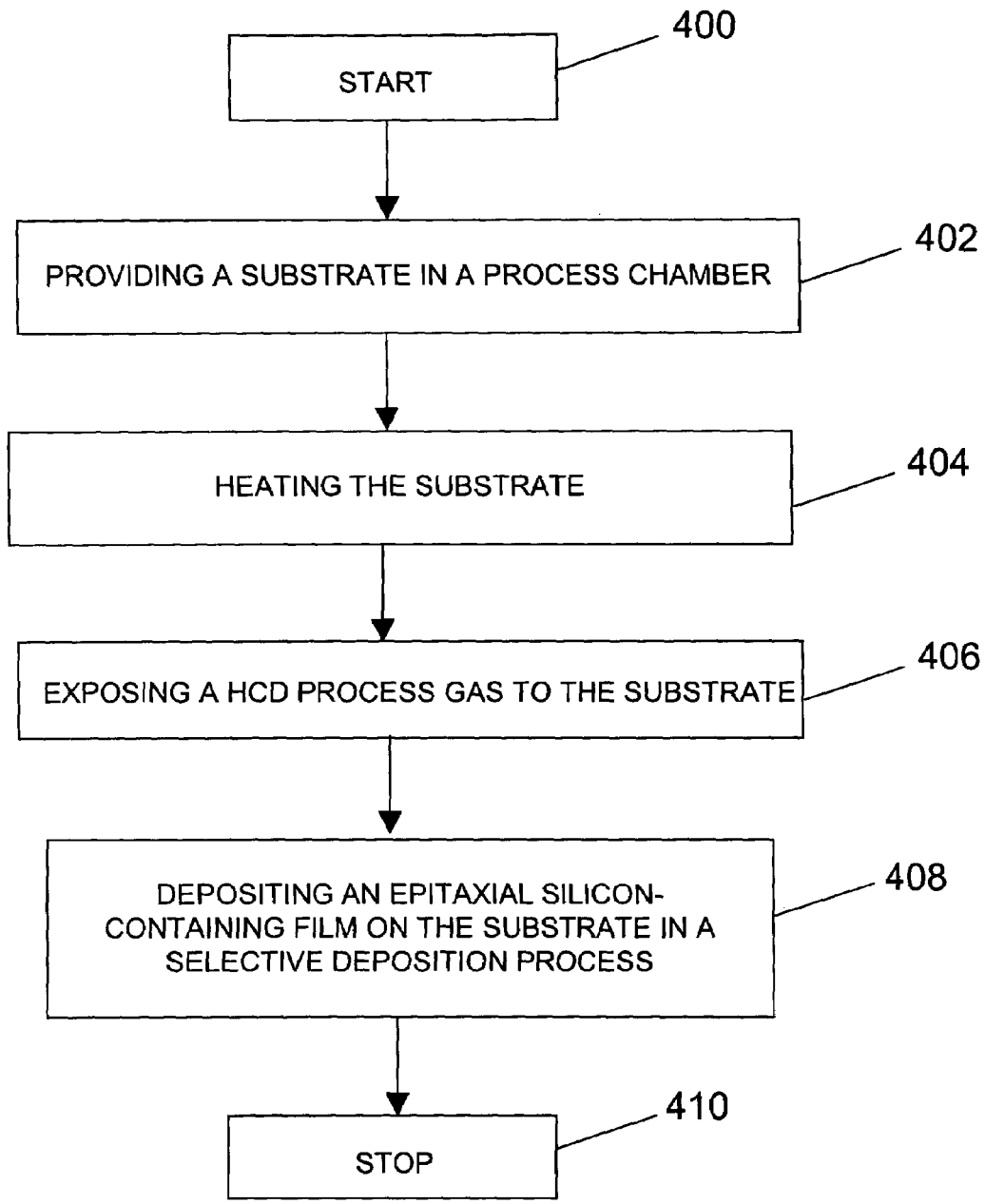
FIG. 4 shows a flow diagram for selectively depositing an epitaxial silicon-containing film on a silicon substrate according to an embodiment of the invention.

FIG. 4 shows a flow diagram for selectively depositing an epitaxial silicon-containing film on a substrate according to an embodiment of the invention. In 400, the process is started. In 402, a substrate is provided in a process chamber of a processing system. Alternately, the processing system may be a single wafer processing system. In 404, the substrate is heated, and in 406, a HCD process gas is exposed to the substrate in the process chamber. In 408, exposure of the HCD process gas to the substrate results in selective deposition of an epitaxial silicon-containing film on a silicon surface. When an epitaxial silicon-containing film with desired film thickness has been selectively deposited, the process ends in 410.

Figure 5A:
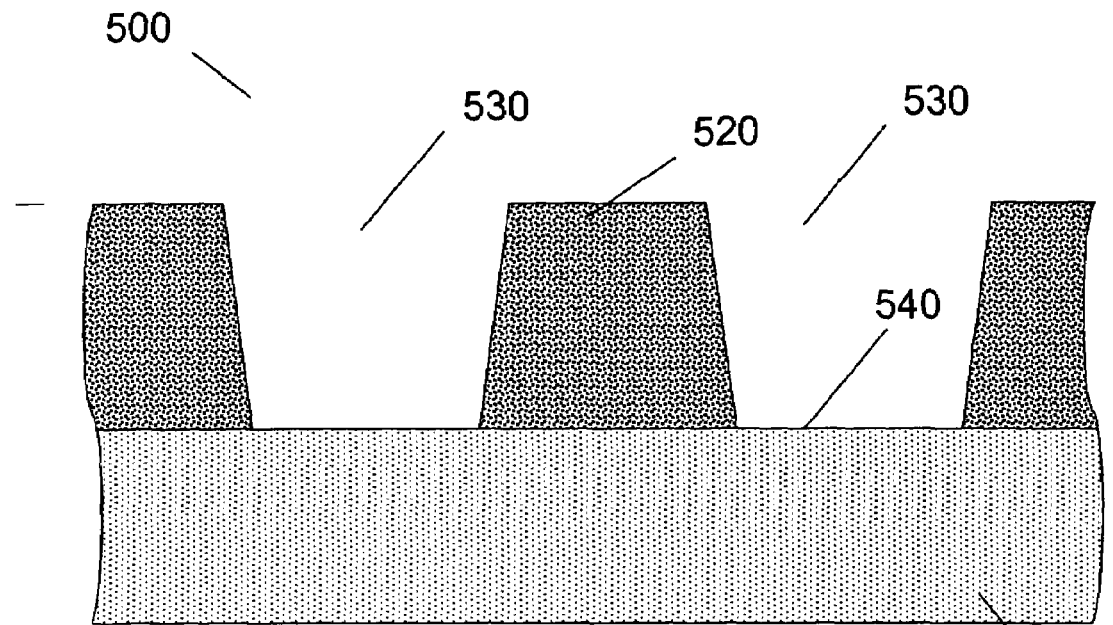
FIG. 5A schematically shows a microstructure according to an embodiment of the invention.

FIG. 5A shows a microstructure according to an embodiment of the invention. The microstructure 500 is an exemplary structure used in the device manufacturing and contains a silicon substrate 510 and an overlying photolithographically patterned oxide mask 520 with openings 530 exposing a silicon surface 540.

Figure 5B:
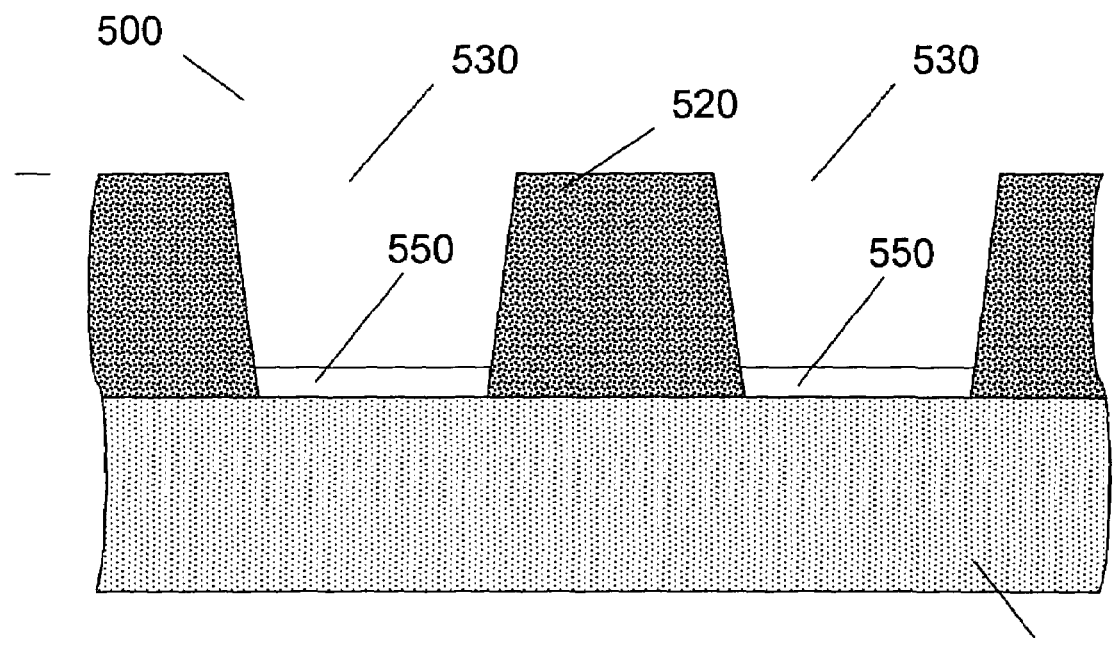
FIG. 5B schematically shows a microstructure having a selectively deposited epitaxial silicon film according to an embodiment of the invention.

FIG. 5B schematically shows a microstructure having a selectively deposited silicon film according to an embodiment of the invention. The silicon film 550 was epitaxially formed on exposed silicon surface 540 of the microstructure 500 at a deposition rate of about 7 angstrom per minute, but no deposition was observed on the patterned photomask 520. The deposition process was carried out as described in the flow diagram of FIG. 4. The deposition process was carried out in a process chamber of a batch type processing system using a HCD gas, a substrate temperature of 800° C., and a process chamber pressure of 0.4 Torr. The microstructure 500 was pretreated in an $H_2$ atmosphere at 900° C. prior to Si deposition. The selective deposition of the epitaxial silicon film 550 on the exposed silicon areas, allows for subsequent removal of the oxide photomask using methods known to those skilled in the art, to form a raised epitaxial silicon film 550 on the silicon substrate 410. In general, the patterned photomask 520 can include at least one of an oxide mask (e.g., $SiO_2$) and a nitride mask (e.g., $Si_3N_4$).

Figure 6:
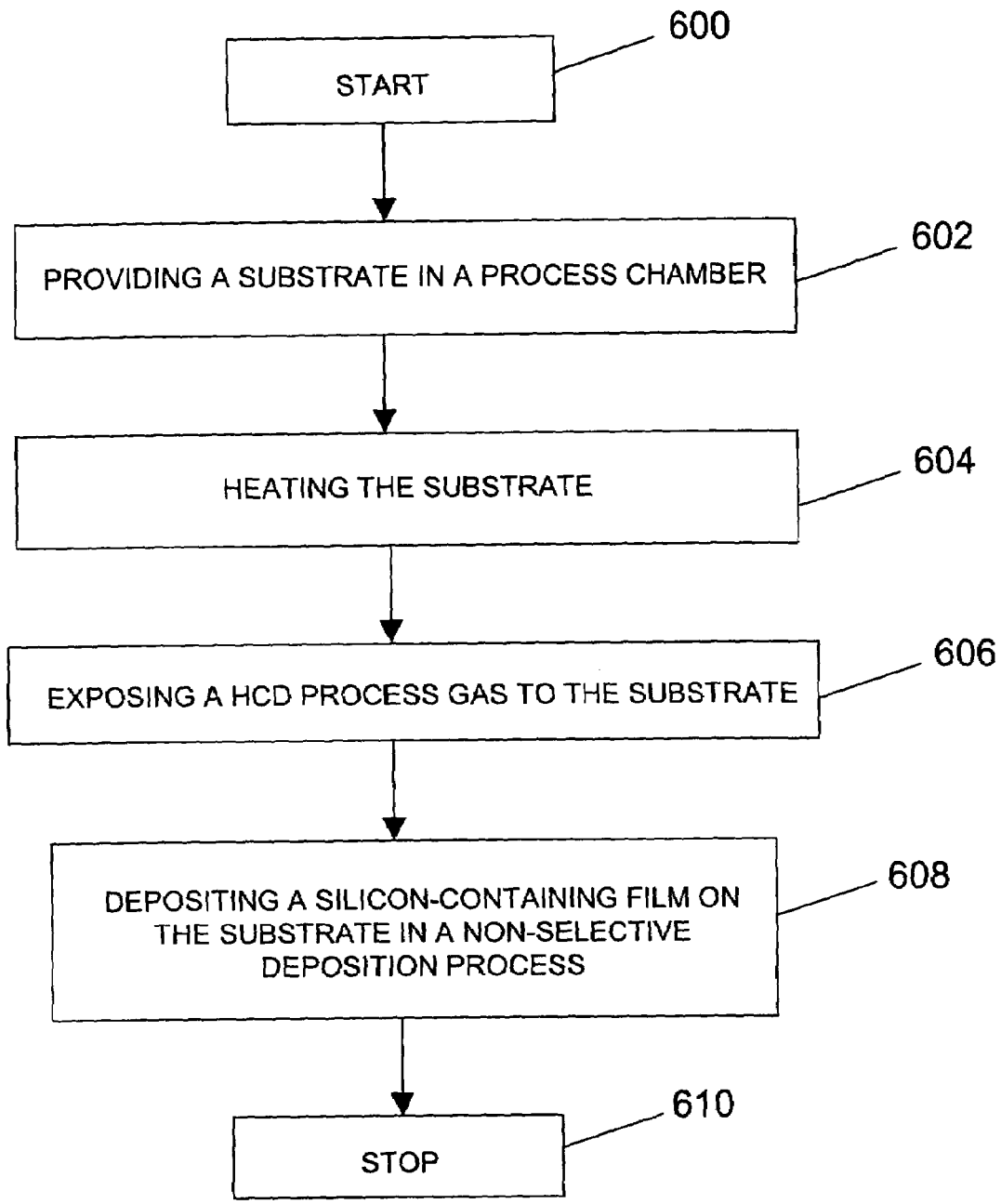
FIG. 6 shows a flow diagram for non-selectively depositing a silicon film on a substrate according to another embodiment of the invention.

FIG. 6 shows a flow diagram for non-selectively depositing a silicon film on a substrate according to another embodiment of the invention. In 600, the process is started. In 602, a substrate is provided in a process chamber of a processing system. In 604, the substrate is heated, and in 606, a HCD process gas is exposed to the substrate in the process chamber. The processing conditions used for non-selective deposition of a silicon layer shown in FIG. 6 can include a substrate temperature of 700° C., compared to a substrate temperature of 800° C. used for selectively depositing an epitaxial silicon layer. In 608, exposure of the HCD process gas to the substrate results in non-selective deposition of a silicon-containing film. When a silicon film with desired film thickness has been deposited, the process ends in 610.

Figure 7A:
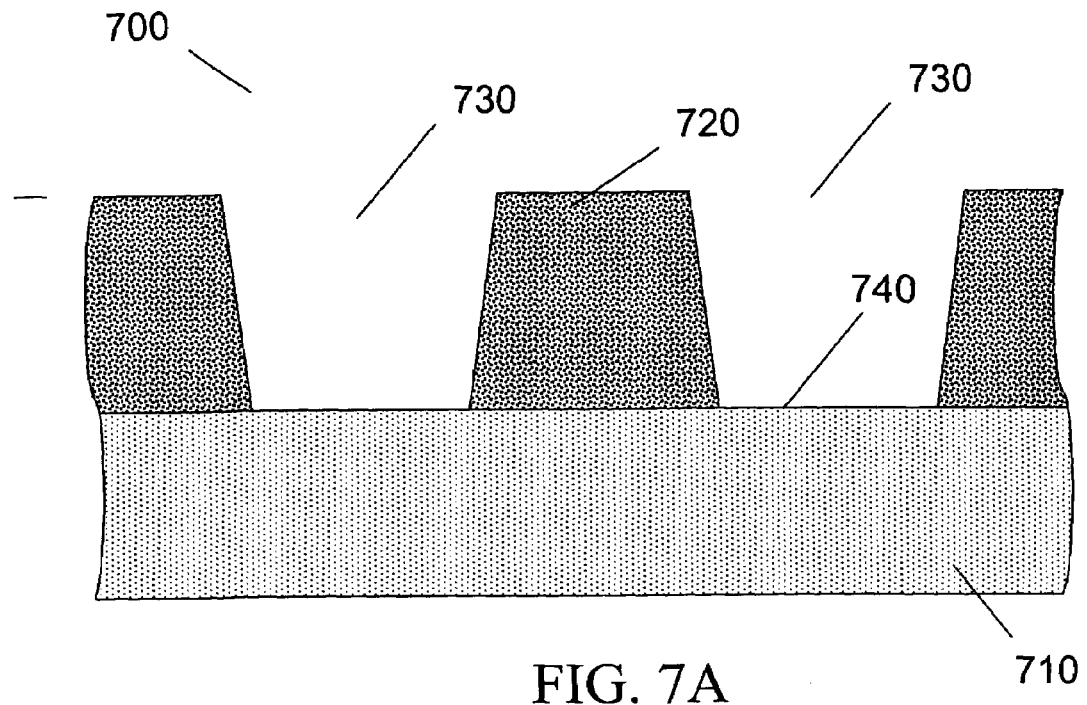
FIG. 7A schematically shows a microstructure according to an embodiment of the invention.

FIG. 7A shows a microstructure according to an embodiment of the invention. The microstructure 700 is an exemplary structure used in the device manufacturing and contains a silicon substrate 710 and an overlying photolithographically patterned oxide mask 720 with openings 730 exposing a silicon surface 740.

Figure 7B:
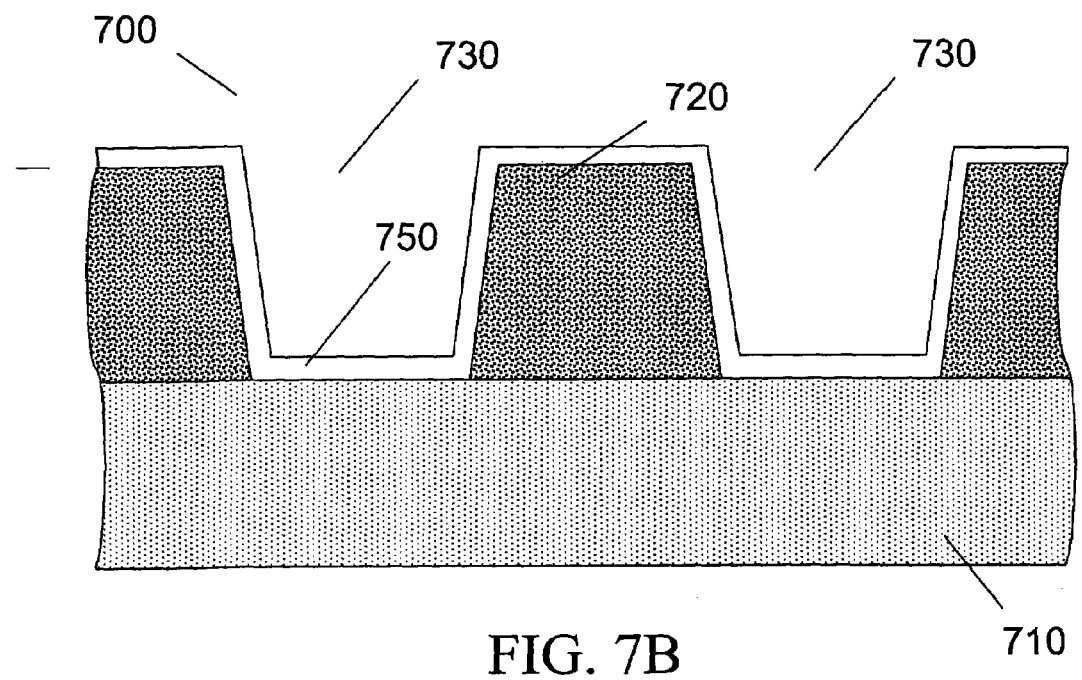
FIG. 7B schematically shows a microstructure having a non-selectively deposited silicon according to an embodiment of the invention.

FIG. 7B schematically shows a microstructure having a non-selectively deposited silicon film according to an embodiment of the invention. The silicon film 750 has been non-selectively deposited (blanket deposition) on the oxide mask 720 and on the silicon surface 740. The silicon film has been deposited on the whole substrate with substantially uniform thickness, regardless of the type of substrate material. The deposition process was carried out as described in the flow diagram of FIG. 6. The deposition process was carried out in a process chamber of a batch type processing system using a HCD gas, a substrate temperature of 700° C. and a process chamber pressure of 0.4 Torr.

Suitable process conditions that enable formation of a silicon-containing film with desired film properties can be determined by direct experimentation and/or design of experiments (DOE). Adjustable process parameters can, for example, comprise substrate temperature, process pressure, type of process gas and relative gas flows. As mentioned above, the HCD process gas can, for example, contain HCD gas and optionally an inert gas and at least one of a hydrogen-containing gas, and a second silicon-containing gas. The HCD gas flow rate can, for example, be between about 5 sccm and about 1,000 sccm, the inert gas flow rate can, for example, be between about 5 sccm and about 20,000 sccm, the hydrogen-containing gas flow rate can, for example, be between about 5 sccm and about 5000 sccm, and the second silicon-containing gas flow rate can, for example, be between about 10 sccm and about 1,000 sccm.

Figure 8:
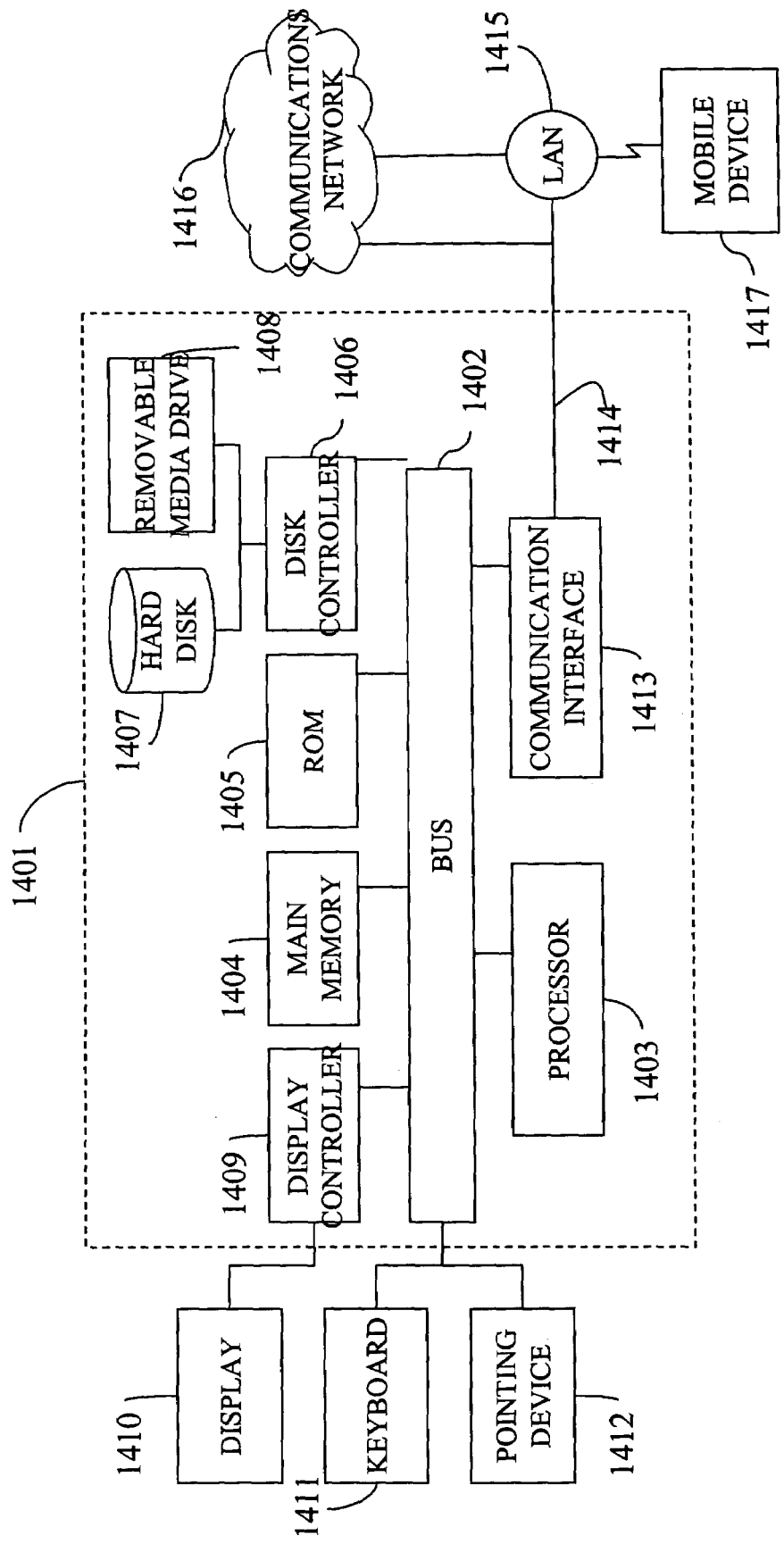
FIG. 8 shows a general purpose computer which may be used to implement the present invention.

FIG. 8 illustrates a computer system 1401 upon which an embodiment of the present invention may be implemented. The computer system 1401 may be used as the controller of FIGS. 1A, 1B, or 2, or a similar controller that may be used with the systems of these figures to perform any or all of the functions described above. The computer system 1401 includes a bus 1402 or other communication mechanism for communicating information, and a processor 1403 coupled with the bus 1402 for processing the information. The computer system 1401 also includes a main memory 1404, such as a random access memory (RAM) or other dynamic storage device (e.g., dynamic RAM (DRAM), static RAM (SRAM), and synchronous DRAM (SDRAM)), coupled to the bus 1402 for storing information and instructions to be executed by processor 1403. In addition, the main memory 1404 may be used for storing temporary variables or other intermediate information during the execution of instructions by the processor 1403. The computer system 1401 further includes a read only memory (ROM) 1405 or other static storage device (e.g., programmable ROM (PROM), erasable PROM (EPROM), and electrically erasable PROM (EEPROM)) coupled to the bus 1402 for storing static information and instructions for the processor 1403.

The computer system 1401 also includes a disk controller 1406 coupled to the bus 1402 to control one or more storage devices for storing information and instructions, such as a magnetic hard disk 1407, and a removable media drive 1408 (e.g., floppy disk drive, read-only compact disc drive, read/write compact disc drive, compact disc jukebox, tape drive, and removable magneto-optical drive). The storage devices may be added to the computer system 1401 using an appropriate device interface (e.g., small computer system interface (SCSI), integrated device electronics (IDE), enhanced-IDE (E-IDE), direct memory access (DMA), or ultra-DMA).

The computer system 1401 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)). The computer system may also include one or more digital signal processors (DSPs) such as the TMS320 series of chips from Texas Instruments, the DSP56000, DSP56100, DSP56300, DSP56600, and DSP96000 series of chips from Motorola, the DSP1600 and DSP3200 series from Lucent Technologies or the ADSP2100 and ADSP21000 series from Analog Devices. Other processors especially designed to process analog signals that have been converted to the digital domain may also be used.

The computer system 1401 may also include a display controller 1409 coupled to the bus 1402 to control a display 1410, such as a cathode ray tube (CRT), for displaying information to a computer user. The computer system includes input devices, such as a keyboard 1411 and a pointing device 1412, for interacting with a computer user and providing information to the processor 1403. The pointing device 1412, for example, may be a mouse, a trackball, or a pointing stick for communicating direction information and command selections to the processor 1403 and for controlling cursor movement on the display 1410. In addition, a printer may provide printed listings of data stored and/or generated by the computer system 1401.

The computer system 1401 performs a portion or all of the processing steps of the invention in response to the processor 1403 executing one or more sequences of one or more instructions contained in a memory, such as the main memory 1404. Such instructions may be read into the main memory 1404 from another computer readable medium, such as a hard disk 1407 or a removable media drive 1408. One or more processors in a multi-processing arrangement may also be employed to execute the sequences of instructions contained in main memory 1404. In alternative embodiments, hard-wired circuitry may be used in place of or in combination with software instructions. Thus, embodiments are not limited to any specific combination of hardware circuitry and software.

As stated above, the computer system 1401 includes at least one computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the computer system 1401, for driving a device or devices for implementing the invention, and for enabling the computer system 1401 to interact with a human user (e.g., print production personnel). Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor 1403 for execution. A computer readable medium may take many forms, including but not limited to, non-volatile media, volatile media, and transmission media. Non-volatile media includes, for example, optical, magnetic disks, and magneto-optical disks, such as the hard disk 1407 or the removable media drive 1408. Volatile media includes dynamic memory, such as the main memory 1404. Transmission media includes coaxial cables, copper wire and fiber optics, including the wires that make up the bus 1402. Transmission media also may also take the form of acoustic or light waves, such as those generated during radio wave and infrared data communications.

Various forms of computer readable media may be involved in carrying out one or more sequences of one or more instructions to processor 1403 for execution. For example, the instructions may initially be carried on a magnetic disk of a remote computer. The remote computer can load the instructions for implementing all or a portion of the present invention remotely into a dynamic memory and send the instructions over a telephone line using a modem. A modem local to the computer system 1401 may receive the data on the telephone line and use an infrared transmitter to convert the data to an infrared signal. An infrared detector coupled to the bus 1402 can receive the data carried in the infrared signal and place the data on the bus 1402. The bus 1402 carries the data to the main memory 1404, from which the processor 1403 retrieves and executes the instructions. The instructions received by the main memory 1404 may optionally be stored on storage device 1407 or 1408 either before or after execution by processor 1403.

The computer system 1401 also includes a communication interface 1413 coupled to the bus 1402. The communication interface 1413 provides a two-way data communication coupling to a network link 1414 that is connected to, for example, a local area network (LAN) 1415, or to another communications network 1416 such as the Internet. For example, the communication interface 1413 may be a network interface card to attach to any packet switched LAN. As another example, the communication interface 1413 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1413 sends and receives electrical, electromagnetic or optical signals that carry digital data streams representing various types of information.

The network link 1414 typically provides data communication through one or more networks to other data devices. For example, the network link 1414 may provide a connection to another computer through a local network 1415 (e.g., a LAN) or through equipment operated by a service provider, which provides communication services through a communications network 1416. The local network 1414 and the communications network 1416 use, for example, electrical, electromagnetic, or optical signals that carry digital data streams, and the associated physical layer (e.g., CAT 5 cable, coaxial cable, optical fiber, etc). The signals through the various networks and the signals on the network link 1414 and through the communication interface 1413, which carry the digital data to and from the computer system 1401 maybe implemented in baseband signals, or carrier wave based signals. The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1401 can transmit and receive data, including program code, through the network(s) 1415 and 1416, the network link 1414, and the communication interface 1413. Moreover, the network link 1414 may provide a connection through a LAN 1415 to a mobile device 1417 such as a personal digital assistant (PDA) laptop computer, or cellular telephone.

Although only certain embodiments of this invention have been described in detail above, those skilled in the art will readily appreciate that many modifications are possible in the exemplary embodiment without materially departing from the novel teachings and advantages of this invention. Accordingly, all such modifications are intended to be included within the scope of this invention.

What is claimed is:

1. A method of depositing a silicon-containing film on a substrate, the method comprising:
   providing a crystalline substrate in a process chamber of a processing system;
   heating the substrate;
   exposing a process gas to the substrate; and
   depositing a silicon-containing epitaxial film on the crystalline substrate using the process gas,
   wherein the process gas consists of HCD gas or HCD gas and at least one gas from the group consisting of a dopant gas, $H_2$, a germanium-containing gas, and an inert gas.

2. The method according to claim 1, wherein the exposing comprises exposing an inert gas to the substrate.

3. The method according to claim 2, wherein the exposing further comprises flowing the HCD gas at a flow rate between about 5 sccm and about 1,000 sccm and the inert gas at a flow rate between about 5 sccm and about 20,000 sccm.

4. The method according to claim 1, wherein the exposing further comprises exposing $H_2$ to the substrate.

5. The method according to claim 1, wherein the exposing further comprises flowing $H_2$ at a flow rate between about 5 sccm and about 5,000 sccm.

6. The method according to claim 1, wherein the dopant is selected from the group consisting of a phosphor-containing gas, a boron-containing gas, and an arsenic-containing gas.

7. The method according to claim 1, wherein the dopant includes at least one of a group consisting of $PH_3$, $B_2H_6$, and $AsH_3$.

8. The method according to claim 1, wherein the exposing further comprises exposing a germanium-containing gas to the substrate.

9. The method according to claim 1, wherein the germanium-containing gas is $GeH_4$.

10. The method according to claim 1, wherein the exposing further comprises exposing $H_2$ and a germanium-containing gas to the substrate.

11. The method according to claim 1, wherein the exposing further comprises exposing $H_2$ and $GeH_4$ to the substrate.

12. The method according to claim 1, wherein
    the exposing comprises exposing a HCD process gas including HCD gas and a germanium-containing gas to the substrate; and
    the depositing comprises depositing a SiGe-containing epitaxial film on the substrate.

13. The method according to claim 12, wherein the depositing comprises selectively depositing, relative to a mask, a SiGe-containing epitaxial film on a silicon surface.

14. The method according to claim 12, wherein the depositing comprises depositing a SiGe-containing epitaxial film having a germanium content below about two atomic percent.

15. The method according to claim 12, wherein the depositing comprises depositing a SiGe-containing epitaxial film having a germanium content greater than about two atomic percent.

16. The method according to claim 1, wherein the heating comprises heating the substrate to between about 500° C. and about 900° C.

17. The method according to claim 1, wherein the heating comprises heating the substrate to between about 700° C. and about 900° C.

18. The method according to claim 1, wherein the heating comprises heating the substrate to a temperature of about 800° C. and the depositing comprises selectively depositing, relative to a mask, an epitaxial silicon-containing film on a silicon surface of the substrate.

19. The method according to claim 1, wherein the heating comprises heating the substrate to a temperature of about 700° C. and the depositing comprises non-selectively depositing the silicon-containing epitaxial film on the substrate.

20. The method according to claim 1, further comprising providing a process chamber pressure less than about 100 Torr.

21. The method according to claim 1, further comprising providing a process chamber pressure less than about 10 Torr.

22. The method according to claim 1, further comprising providing a process chamber pressure of about 0.4 Torr.

23. The method according to claim 1, further comprising:
pretreating the substrate prior to exposing a HCD process gas to the substrate.

24. The method according to claim 23, wherein the pretreating comprises exposing a $H_2$ gas to the substrate at a substrate temperature between about 500° C. and about 1000° C.

25. The method according to claim 23, wherein the pretreating comprises exposing a $H_2$ gas to the substrate at a substrate temperature of about 900° C.

26. The method according to claim 1, further comprising pretreating the substrate with $H_2$ at 500° C. before the exposing a process gas to the substrate.

27. A computer readable medium containing program instructions for execution on a processor, which when executed by the processor, cause a processing apparatus to perform the steps in the method recited in claim 1.

28. A method of depositing a silicon-containing film on a substrate, the method comprising:
providing a substrate in a process chamber of a processing system;
heating the substrate;
exposing a process gas to the substrate; and
depositing a silicon-containing epitaxial film on the substrate using the process gas,
wherein the depositing comprises selectively depositing, relative to a mask, an epitaxial Si film on a crystalline Si substrate,
wherein the process gas consists of HCD gas or HCD gas and at least one gas from the group consisting of a dopant gas, $H_2$, a germanium-containing gas, and an inert gas.

29. A method of depositing a silicon-containing film on a substrate, the method comprising:
providing a substrate in a process chamber of a processing system;
heating the substrate;
exposing a process gas to the substrate; and
depositing a silicon-containing epitaxial film on the substrate using the process gas,
wherein the depositing comprises selectively depositing, relative to a mask, an epitaxial SiGe film on a crystalline Si substrate,
wherein the process gas consists of HCD gas and a germanium-containing gas or HCD gas and a germanium-containing gas and at least one gas from the group consisting of a dopant gas, $H_2$, and an inert gas.

* * * * *